United States Patent
Daub et al.

(10) Patent No.: US 6,329,754 B1
(45) Date of Patent: Dec. 11, 2001

(54) DIAGNOSTIC SYSTEM FOR A BALLAST OF A HIGH-PRESSURE GAS DISCHARGE LAMP FOR A MOTOR VEHICLE

(75) Inventors: Wolfgang Daub, Anroechte; Volker Radtke, Guetersloh, both of (DE)

(73) Assignee: Hella KG Hueck & Co. (DE)

( * ) Notice: Subject to any disclaimer, the term of this patent is extended or adjusted under 35 U.S.C. 154(b) by 0 days.

(21) Appl. No.: 09/615,946

(22) Filed: Jul. 13, 2000

Related U.S. Application Data

(63) Continuation of application No. PCT/EP99/08682, filed on Nov. 11, 1999.

(30) Foreign Application Priority Data

Nov. 13, 1998 (DE) .............................................. 198 52 350

(51) Int. Cl.⁷ .................................................... H01K 7/00
(52) U.S. Cl. ................. 315/76; 315/307; 361/90
(58) Field of Search .......................... 315/76, 77, 209 R, 315/225, 291, 307, DIG. 7; 307/326; 361/90, 91

(56) References Cited

U.S. PATENT DOCUMENTS

| | | | |
|---|---|---|---|
| 5,151,631 | 9/1992 | Oda et al. | 315/127 |
| 5,347,224 | * 9/1994 | Brokaw | 307/362 |
| 5,452,173 | * 9/1995 | Brannon et al. | 361/90 |
| 5,751,115 | * 5/1998 | Jayaraman et al. | 315/225 |

FOREIGN PATENT DOCUMENTS

| | | |
|---|---|---|
| A5291873 | 7/1991 | (DE) . |
| A1-4343747 | 6/1994 | (DE) . |
| C1-4341058 | 4/1995 | (DE) . |
| A1-49200579 | 1/1992 | (WO) . |

* cited by examiner

Primary Examiner—Don Wong
Assistant Examiner—Thuy Vinh Tran

(57) ABSTRACT

A diagnostic system for a ballast of a high-pressure gas discharge lamp in a motor vehicle includes the ballast and a separate light control module that controls the ballast via a supply line and in case of a fault, the ballast gives a modulated diagnostic signal via the supply line to the light control module. For this, in case of a fault, the ballast modulates a current that is received, using a switchable current sink, such that the light control module receives coded diagnostic information via the supply line.

6 Claims, 2 Drawing Sheets

DIAGNOSTIC SYSTEM FOR A BALLAST OF A HIGH-PRESSURE GAS DISCHARGE LAMP FOR A MOTOR VEHICLE

This application is a continuation of PCT/EP99/08682 filed Nov. 11, 1999.

BACKGROUND OF THE INVENTION

This invention involves a diagnostic system for a ballast of a high-pressure gas discharge lamp for a motor vehicle, having a light control module, which connects the ballast to an operating voltage source and monitors current reception of the ballast, and with the ballast, having: a voltage converter for supplying voltage to the high-pressure gas discharge lamp, a safety circuit for recognizing fault functions of the ballast and the high-pressure gas discharge lamp and turning the voltage converter off in case of a fault, and a diagnostic circuit for generating a fault signal in case of a fault.

Increasingly in more and more motor vehicles, illumination devices are being switched on or off via a light control module. A light control device for a motor vehicle is disclosed in DE 43 41 058 C1, with this example showing that a device of this type can be very complex. That is, here both a light control module as well as a lamp module are structured as "intelligent" structural assemblies, i.e. provided with a microcomputer, such that this type of light control device is quite expensive. Particularly in motor vehicle technology, however, constructions of light control devices that are especially simple are preferred for cost reasons.

For the most part, a light control module has a device for current control, which indicates to a vehicle driver, if incandescent lamps are controlled for example, whether an incandescent lamp must be changed. This is problematic in the control of high-pressure gas discharge lamps, which are increasingly used in motor vehicles, since they are driven by a ballast. In high-pressure gas discharge lamps, the light control module can not namely distinguish whether the lamp or its associated ballast is defective. Thus, it is advantageous, if the ballast takes over the diagnostics and transmits data to the light control module.

Standard commercial ballasts for high-pressure gas discharge lamps, for example such as those of the assignee, have for this purpose a diagnostic output, which is connected to the light control module via a diagnostic line. The cable expense for an additional diagnostic line per ballast thus causes additional costs, and this is also true for structural components for the output of diagnostic signals (output drivers, possibly even a microprocessor) within the ballast, with these additional costs accruing even if the diagnostic possibility is not to be used in a motor vehicle.

It is thus an object of this invention to create a diagnostic system for a ballast of a high-pressure gas discharge lamp in a motor vehicle, which is especially uncomplicated and inexpensive in structure.

SUMMARY OF THE INVENTION

According to principles of the invention in case of a fault, a diagnostic circuit modulates, as a function of the type of the fault that has occurred, current reception of a ballast using a switchable current sink and a light control module transforms the modulated current into a voltage signal and recognizes the type of the fault that has occurred from the voltage signal.

The diagnostic device of this invention thus advantageously does not require its own diagnostic line, since the diagnostic information is transmitted through a quiescent-current modulation on the supply line of the ballast.

Moreover, the expense of structural parts, for creating, transmitting and evaluating the diagnostic information in the ballast and in the light control device, is extremely small. Thus, no additional special outputs and inputs are required for the diagnostic information.

Additional advantageous embodiments and further developments of the diagnostic system of this invention result from the dependent claims.

Thus, the modulated quiescent current can advantageously be transformed, via a resistor that is connected in the supply line or via an output resistor of a current mirror circuit, into a voltage signal, which is captured at an input of switching and evaluation logic and evaluated by the switching and evaluation logic as to the type of the fault that has occurred.

The modulation of the quiescent current can advantageously be a pulse-width modulation at a low frequency, since this is not affected by a filter that eliminates high-frequency interfering pulses of the ballast (EMC filter).

It is especially advantageous for the diagnostic signal to be a square wave frequency with a defined pulse width. By allocation of a specific frequency to each possible fault, a simple coding of the faults can be achieved. In this way, the diagnostic data can be decoded both from frequency as well as from average value of the signal voltage.

Likewise, it is of special advantage for a fault-dependent modulation of this type to also be created in a ballast "without intelligence", that is, without its own microcomputer, such that the ballast can be structured to be especially cost-effective. A microcomputer is only provided for the switching and evaluation logic of the light control module.

Furthermore, it is advantageous to display faults that have occurred to the driver in a display element, and furthermore, to save them also for later fault analyses in a fixed memory register (EEPROM).

BRIEF DESCRIPTION OF THE DRAWINGS

In the following, an embodiment of a diagnosis device of this invention is depicted in drawings and explained in greater detail.

Shown are.

Both Figures are greatly simplified in their representations and show only the components essential for explaining the invention.

DETAILED DESCRIPTION OF THE INVENTION

Figure 1:
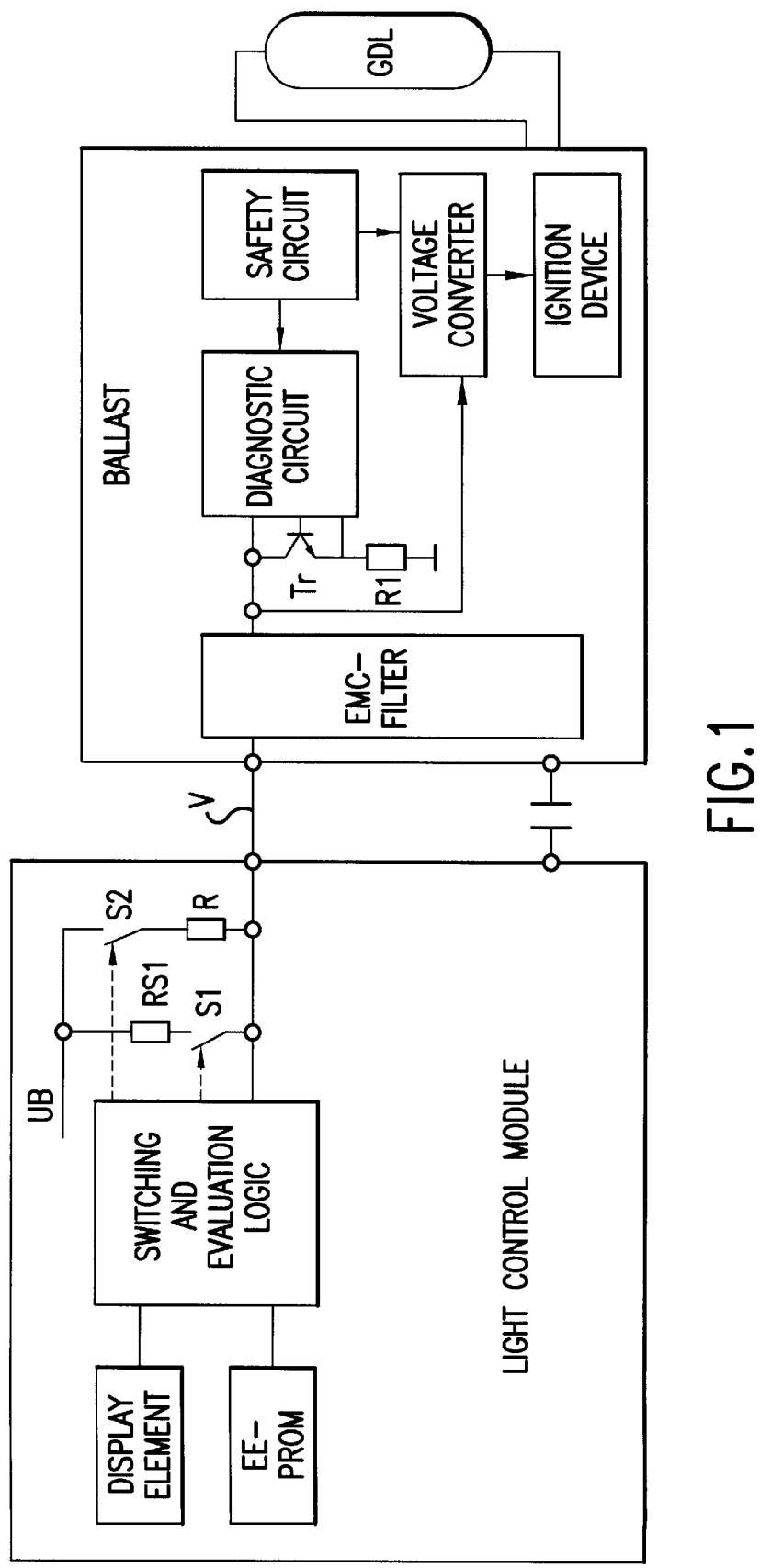
FIG. 1 is a schematic diagram of a diagnostic device of this invention.

FIG. 1 shows a ballast for a high-pressure gas discharge lamp (GDL). The ballast has a safety circuit, which recognizes faults of the ballast or the high-pressure gas discharge lamp (GDL) or receives signals from other internal components of the ballast regarding recognized faults, and which, in case of a fault, turns off a voltage converter which supplies the high-pressure gas discharge lamp (GDL) with a necessary operating voltage. An ignition device which generates a high voltage ignition impulse necessary to start the gas discharge is thereby connected between the voltage converter and the high-pressure gas discharge lamp,.

A diagnostic circuit is connected to the safety circuit which, in the case of a fault, signals, in a manner of this invention, the type of fault that has occurred to a light control module.

The light control module is connected to the ballast using a supply line (V) and connects the supply line via a controllable switch ($S_1$) and a very low-ohmic resistor ($R_{S1}$) to an operating voltage source (UB) for the ballast. By an evaluation of the voltage drop at the resistor ($R_{S1}$), the circuit and evaluation logic can recognize an interruption or an accidental grounding of the supply line (V); additional diagnostic possibilities in terms of internal faults of the ballast are not possible with it, however.

Such internal faults could be, in particular:
too low an operating voltage
maximum ignition time exceeded without an ignition pulse being counted
maximum ignition time of at least one ignition pulse being exceeded
maximum number of ignition pulses exceeded
short-circuit in the lamp circuit
a short-circuit on a lamp circuit side to vehicle ground.

A concept of the invention then is, depending on the type of the fault that led to the internal switching off of the ballast, to modulate a quiescent current reception so that the light control module can evaluate the fault and, for example, store it in a non-volatile memory register (EEPROM) and display it on a display element to a driver. The diagnostic operating status is activated by a fault signal, which occurs if the ballast is supplied with the operating voltage and the lamp goes out. It also functions to stop the voltage converter.

The modulation of the quiescent current in case of a fault is done by a connected current sink (Tr, $R_1$). This modulated quiescent current can be converted in the light control device, for example at a pull-up resistor (R) or at a voltage source or via a current mirror circuit ($Tr_{SQ1}$, $Tr_{SQ2}$) into a voltage signal that can be evaluated. In the selection of the modulation process, an attenuation effect of an input capacitance of the ballast and the EMC filter, which keep high-frequency interference signals from the supply line (V), must be taken into account. Thus, a low-frequency pulse-width modulation for the transfer of the diagnostic signals is especially advantageous.

In the following, an operation of the diagnostic system of this invention is explained using FIG. 1:

The ballast is connected to the light control module via the supply line (V) and is turned on by it via the controllable switch ($S_1$). In case of a fault, when the high-pressure gas discharge lamp (GDL) is extinguished, and the voltage converter of the ballast is stopped, the diagnostic circuit is activated. The light control device, recognizing at this point in time that the operating current of the ballast has fallen below a pre-specified value, closes the controllable switch ($S_2$) and then opens the switch ($S_1$), in order to be able to receive the diagnostic signal, evaluate it, and store the fault in a fixed memory register (EEPROM) and show it in the display element.

The transistor (Tr) and the resistor ($R_1$) form a switchable current sink, such that a voltage drop at the resistor ($R_1$) is held constant when the transistor (Tr) is turned on and thus the current is defined by the transistor (Tr).

The pull-up resistor (R) in the light control module is designed in such a manner, that the operating voltage at the ballast does not fall below a necessary minimum (for example 6 volts).

The diagnostic circuit of the ballast then modulates, as a function of the type of the fault that occurred, the quiescent current reception of the ballast in the form of a pulse-width modulated signal on the supply line (V). By allocating a specific frequency for each possible fault, a simple coding of the fault can be achieved, with it being especially advantageous if the diagnostic signal is a square wave frequency having a defined pulse width. In this case, the circuit and evaluation logic can decode the diagnostic data from a frequency as well as from an average value of the signal voltage.

Figure 2:
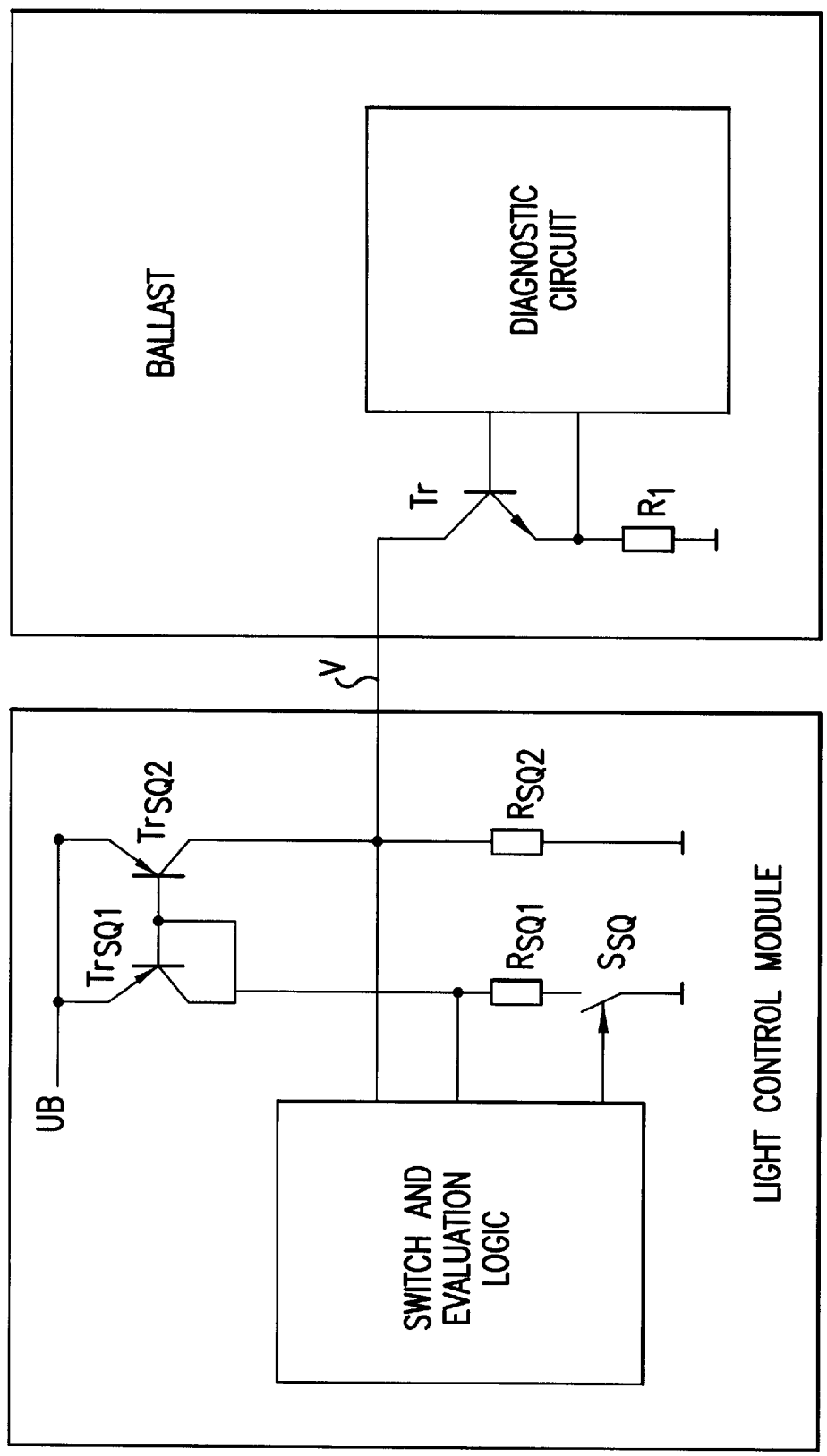
FIG. 2 is a circuit diagram of several circuit details of the diagnostic device of this invention.

FIG. 2 shows a further simplified representation of components of the ballast and the light control module. Using this circuit, a possible type of transformation of the modulated quiescent current signal into a voltage signal that can be evaluated is explained, indeed using a so-called current mirror circuit.

The light control module activates, in case of a fault, the controllable switch ($S_{SQ}$) and impresses a defined current into the current mirror ($Tr_{SQ1}$, $Tr_{SQ2}$). The ballast modulates, using the switchable current sink (Tr, $R_1$), the quiescent current reception on the supply line (V), so that the constant current at the output of the current mirror ($Tr_{SQ1}$, $Tr_{SQ2}$) is sometimes applied via the resistor ($R_{SQ2}$) and sometimes additionally via the switchable current sink (Tr, $R_1$), so that a time-dependent voltage signal is applied on the resistor ($R_{SQ2}$), and therefore on the voltage line (V), which signal is evaluated by the circuit and evaluation logic for fault recognition. An amplitude of the voltage signal on the supply line (V) can be adjusted automatically with the help of the impressed current.

Reference character list
Diagnostic system for the ballast of a high-pressure gas discharge lamp in a motor vehicle

| | |
|---|---|
| EEPROM | non-volatile memory |
| GDL | high-pressure gas discharge lamp |
| R, $R_1$, $R_{S1}$, $R_{SQ1}$, $R_{SQ2}$ | resistors |
| special: R | pull-up resistor |
| $R_{SQ2}$ | output resistor |
| $S_1$, $S_2$, $S_{SQ}$ | (controllable) switch |
| Tr, $Tr_{SQ1}$, $Tr_{SQ2}$ | transistors |
| UB | operating voltage source |
| V | supply line |
| (Tr, $R_1$) | switchable current sink |
| ($Tr_{SQ1}$, $Tr_{SQ2}$) | current mirror (circuit) |

What is claimed is:

1. Diagnostic system for a ballast of a high-pressure gas discharge lamp of a motor vehicle, said system including said ballast and a light control module, with the light control module connecting the ballast to an operating voltage source (UB) via a supply line (V) extending between said light control module and ballast and monitoring on said supply line (V) a current reception of the ballast, wherein said ballast and said light control module are spatially separated from one another, said ballast including a voltage converter for supplying voltage to the high-pressure gas discharge lamp, a safety circuit for recognizing failed functions of the ballast and the high-pressure gas discharge lamp, which safety circuit turns the voltage converter off in case of fault, and a diagnostic circuit, which generates a fault signal in case of fault; wherein, in case of a fault, the diagnostic circuit of the ballast modulates the current reception of the ballast on said supply line (V), using a switchable current sink (Tr, $R_1$) as a function of a type of fault that has occurred and the light control module transforms the modulated current into a voltage signal and recognizes the type of fault that has occurred from the voltage signal.

2. Diagnostic system according to claim 1, wherein the light control module connects the ballast with the operating voltage source (UB) via a resistor (R) for transforming the modulated current into a voltage signal, and the light control module evaluates the voltage signal at this resistor (R).

3. Diagnostic system according to claim 1, wherein, upon a fault, the light control module impresses a defined current into a current mirror circuit ($Tr_{SQ1}$, $Tr_{SQ2}$), an output resistor ($R_{SQ2}$) of which is connected via the supply line (V) to the switchable current sink (Tr, $R_1$) of the ballast, and a switching and evaluation logic of the light control module evaluates the voltage signal at the output resistor ($R_{SQ2}$) for recognizing the fault that has occurred.

4. Diagnostic system according to claim 1, wherein the light control module saves a recognized fault in a fixed memory register (EEPROM).

5. Diagnostic system according to claim 1, wherein the light control module displays the recognized fault on a display component.

6. Diagnostic system according to claim 1, wherein the diagnostic circuit codes the type of the fault that has occurred using a square wave frequency with a defined pulse width.

* * * * *